(12) United States Patent
Prentice

(10) Patent No.: US 7,057,469 B2
(45) Date of Patent: Jun. 6, 2006

(54) HIGH SPEED DIFFERENTIAL VOLTAGE CONTROLLED OSCILLATOR

(75) Inventor: John S. Prentice, Palm Bay, FL (US)

(73) Assignee: Conexant, Inc., Red Bank, NJ (US)

( * ) Notice: Subject to any disclaimer, the term of this patent is extended or adjusted under 35 U.S.C. 154(b) by 19 days.

(21) Appl. No.: 10/321,116

(22) Filed: Dec. 17, 2002

(65) Prior Publication Data

US 2004/0046616 A1   Mar. 11, 2004

Related U.S. Application Data

(60) Provisional application No. 60/408,305, filed on Sep. 5, 2002.

(51) Int. Cl.
*H03B 5/00* (2006.01)

(52) U.S. Cl. .............................. 331/117 R; 331/117 FE; 331/167; 331/185; 331/175; 331/177 V

(58) Field of Classification Search ................ 331/185, 331/175, 117 R, 117 FE, 167, 177 V, 116 FE
See application file for complete search history.

(56) References Cited

U.S. PATENT DOCUMENTS

| | | | | |
|---|---|---|---|---|
| 5,920,235 A | * | 7/1999 | Beards et al. | 331/108 D |
| 6,064,277 A | * | 5/2000 | Gilbert | 331/117 R |
| 6,081,167 A | * | 6/2000 | Kromat | 331/108 C |
| 6,750,727 B1 | * | 6/2004 | Sutardja | 331/117 R |

\* cited by examiner

*Primary Examiner*—Arnold Kinkead
(74) *Attorney, Agent, or Firm*—Hunton & Williams LLP

(57) ABSTRACT

A differential negative resistance source that provides negative resistance to a differential resonator of a differential VCO. The differential negative resistance source includes first and second active devices, each having first and second current terminals and a control terminal, first and second current sinks, each coupled to a corresponding one of the second current terminals of the first and second active devices, and at least one capacitive device coupled between the second terminals of the first and second active devices. The capacitive device and the separate current sinks form a capacitive degeneration circuit that operates to reduce or otherwise eliminate net differential capacitance at the output of the differential negative resistance source. The capacitive degeneration offsets extra capacitance, which enables an increase of the maximum operating frequency for a given process, and which enables the VCO to be less sensitive to operating conditions.

21 Claims, 1 Drawing Sheet

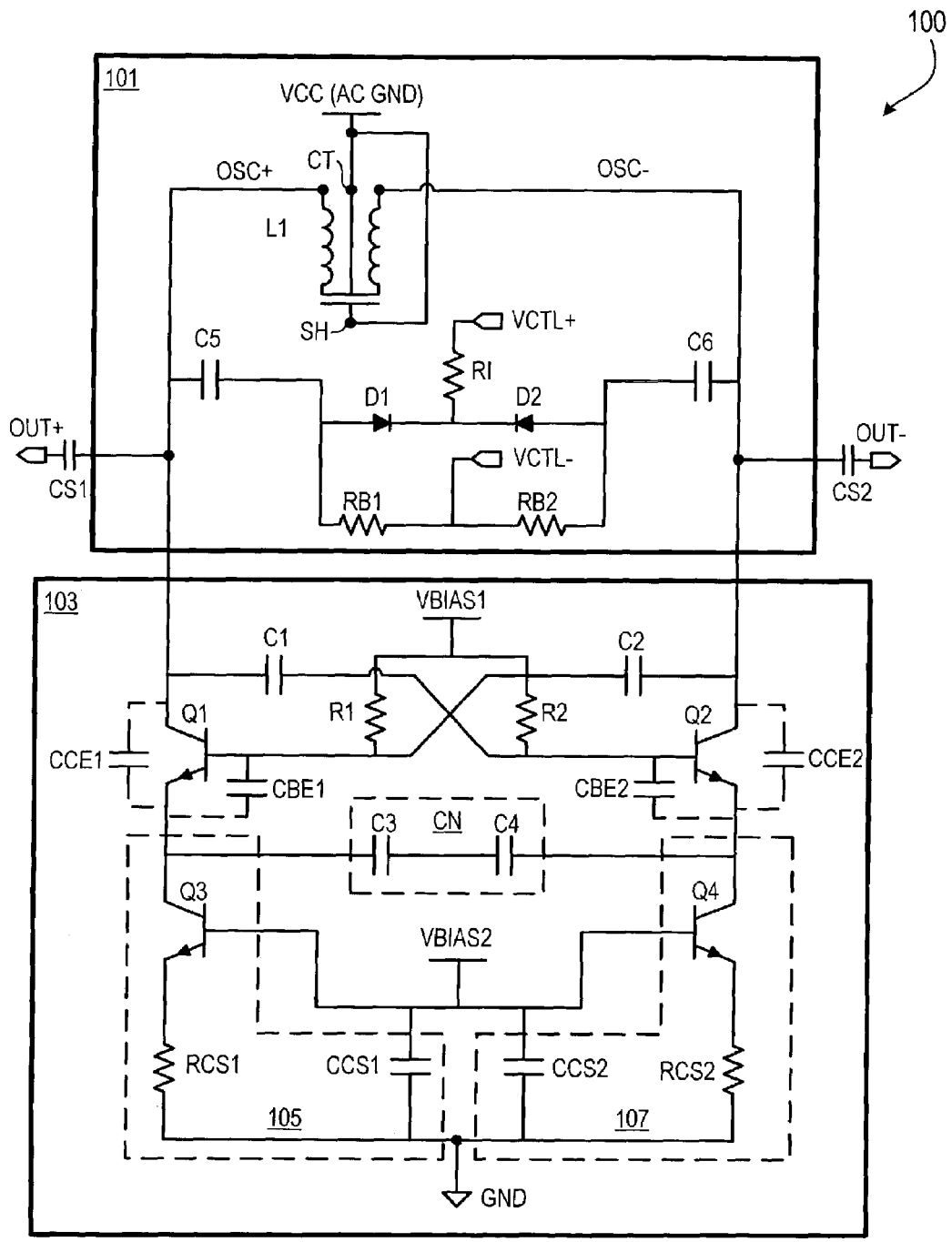

HIGH SPEED DIFFERENTIAL VOLTAGE CONTROLLED OSCILLATOR

CROSS-REFERENCE TO RELATED APPLICATION(S)

The present application is based on U.S. Provisional Patent Application entitled "High Speed Differential Voltage Controlled Oscillator", Ser. No. 60/408,305, filed Sep. 5, 2002, which is hereby incorporated by reference in its entirety.

FIELD OF THE INVENTION

The present invention relates to voltage controlled oscillators, and more particularly to a differential voltage controlled oscillator (VCO) including a differential negative resistance source with capacitive degeneration for enabling higher frequency operation and improved noise tolerance.

DESCRIPTION OF RELATED ART

Low noise oscillators are required for high data rate communication systems because variations in the oscillator frequency due to noise mask data and degrade performance. A low noise oscillator requires a relatively high Q (factor) resonator circuit in which the energy stored per cycle in the reactive impedances is large compared to the energy lost per cycle by the resistances. There are many types of oscillators and different approaches to analyzing their operation. The style of VCO described herein is usually referred to as a negative resistance oscillator, in which active device(s) supply energy to a resonator. The active device(s) operate as a negative resistor to supply energy to the resonator to compensate for losses without significantly affecting the resonant frequency of operation. Integrated VCOs are often of a differential configuration using a cross-coupled differential pair of transistors, such as bipolar junction transistors (BJTs) or metal-oxide semiconductor field-effect transistors (MOSFETs) or the like, as the active devices. For the differential configuration, some, if not all, of the resonant elements are connected differentially between the collectors (BJT configuration) or drains (MOSFET configurations).

Since the resonate frequency is set by the magnitude of the inductive and capacitive impedances which are equal at resonance, it is desirable that the active devices contribute little reactive impedance of the resonator. There is always some delay, however, as the signal propagates through the active devices. For example, the collector (drain) currents do not react instantaneously to changes in base (gate) voltages. Such delay, however, is insignificant if the resonant frequency is several orders of magnitude below the maximum frequency, $f\tau$, of the active devices. The delay does not become significant until it becomes greater than a small fraction of a quarter of a period of the resonant frequency. If the active device delay becomes significant, then the active device negative resistance generator has an output impedance that has a capacitive impedance in addition to its negative resistance.

Any extra capacitive impedance, or extra capacitance, of the negative negative resistance source degrades oscillator performance in several ways. The tuning range is degraded by the extra capacitance unless the percentage of tunable capacitance is increased. This requires the use of a smaller inductor to maintain the same VCO frequency range. The inductor losses do not increase proportionally with decreasing inductance and the tunable capacitors contribute more loss, so that the Q factor at resonant frequency decreases. Furthermore, the extra capacitance from the active devices is dependent upon bias conditions and is modulated by all of the noise sources within the active devices and any unfiltered noise from the bias network. The extra capacitance, therefore, degrades oscillator noise performance and makes the oscillator more susceptible to modulation by external sources, such as supply voltage.

The delay factor for active devices has become a limiting factor for higher frequency oscillators needed for modern communications systems. For example, the delay from base voltage to collector current causes a concomitant rotation of the output impedance of the negative resistor source, generating a significant capacitive component. The capacitive component causes a rotated transconductance, which increases capacitive admittance. It is desired to improve oscillator noise performance, such as by increasing the maximum operating frequency for a given integrated circuit process and to make the VCO less sensitive to particular processes and/or operating conditions.

SUMMARY OF THE INVENTION

A differential negative resistance source according to an embodiment of the present invention provides negative resistance to a differential resonator of a differential voltage controlled oscillator (VCO). The differential negative resistance source includes first and second active devices, each having first and second current terminals and a control terminal, first and second current sinks, each coupled to a corresponding one of the second current terminals of the first and second active devices, and at least one capacitive device coupled between the second terminals of the first and second active devices.

A differential negative resistance VCO according to an embodiment of the present invention includes a resonator and a differential negative resistance source. The resonator has first and second terminals that generate a differential oscillation signal with first and second polarity signals. The differential negative resistance source includes first and second transistors, each having a controlled current path and a control terminal, where the controlled current path of each of the first and second transistors is coupled to a respective one of the first and second polarity signals of the differential oscillation signal. The capacitive degeneration circuit is coupled to the controlled current paths of the first and second transistors and is operative to cancel at least a portion of extra capacitance of the differential negative resistance source applied to the resonator.

A method of optimizing operation of a differential VCO having a differential resonator with a differential oscillation output, includes coupling a differential output of a differential pair of transistors to the differential oscillation output, splitting the differential pair of transistors into first and second transistors by coupling a first DC bias current sink to a current terminal of the first transistor and coupling a second DC bias current sink to a current terminal of the second transistor, and adding at least one capacitor between the current terminals of the first and second transistors.

BRIEF DESCRIPTION OF THE DRAWING

A better understanding of the present invention can be obtained when the following detailed description of exemplary embodiments is considered in conjunction with the FIGURE, which is a schematic diagram of a differential VCO including a differential negative resistance source implemented according to an embodiment of the present invention.

DETAILED DESCRIPTION OF EMBODIMENT(S) OF THE INVENTION

The FIGURE is a schematic diagram of a differential VCO 100 including a differential negative resistance source 103 implemented according to an embodiment of the present invention. The differential VCO 100 includes a differential resonator 101 coupled to the differential negative resistance source 103 at respective polarities, OSC+ and OSC−, of a differential oscillation signal OSC. The differential resonator 101 includes a shielded, center tap inductor L1 having a first terminal on one side coupled to OSC+, a second terminal on an opposite side coupled to OSC−, and a center tap (CT) coupled to a DC power supply signal VCC. The inductive halves of the inductor L1 are mutually coupled. The inductor L1 includes a Faraday shield (SH) for isolation, which is also coupled to VCC. VCC is decoupled, serves as an AC ground, and provides voltage bias for bipolar junction transistors (BJTs) Q1 and Q2, described further below.

In the differential resonator 101, OSC+ is coupled to one end of a capacitor C5 and to one end of a first sense capacitor CS1. The capacitors illustrated may be thin film or metal-insulator-metal (MIM) capacitors commonly used for integrated circuit processes as known to those skilled in the art of IC fabrication. The capacitors could be schematically illustrated with one curved plate representing the bottom plate as differentiated from the top plate because there is usually a parasitic capacitance from the bottom plate to the substrate for an integrated circuit capacitor. Nonetheless, any type of capacitor is contemplated and are shown generically. The other end of the sense capacitor CS1 develops a first polarity OUT+ of an output signal OUT. In the embodiment shown, the differential VCO 100 is an integrated VCO implemented on an integrated circuit (IC). It is appreciated, however, that the differential VCO 100 may be implemented using discrete components and that the present invention is not limited to integrated embodiments.

One end of the capacitor C5 is coupled to the anode of a varactor diode D1 and to one end of a bias resistor RB1. The cathode of diode D1 is coupled to one end of an isolation resistor RI and to the cathode of another varactor diode D2. The varactor diodes D1 and D2 are normally reversed biased and operate as voltage controlled capacitors. The other end of the resistor RI receives a positive polarity VCTL+ of a control voltage signal VCTL. The other end of the resistor RB1 receives a negative polarity VCTL− of the VCTL signal and is coupled to one end of another bias resistor RB2. The OSC− polarity of the OSC signal is coupled to one end of another capacitor C6 and to one end of a second sense capacitor CS2. The other end of the sense capacitor CS2 develops a second polarity OUT− of the OUT signal. The other end of the capacitor C6 is coupled to the anode of the varactor diode D2 and to the other end of the resistor RB2. The resistors RI, RB1 and RB2 provide AC isolation and determine DC operating levels.

In the differential resistance source 103, the OSC+ polarity is coupled to one end of a capacitor C1 and to the collector of Q1. The OSC− polarity is coupled to one end of a capacitor C2 and to the collector of Q2. The other end of capacitor C1 is coupled to the base of Q2 and the other end of capacitor C2 is coupled to the base of Q1 forming a cross-coupled feedback circuit configuration. The cross-coupled configuration of the capacitors C1 and C2 provides positive feedback for the transistors Q1 and Q2. It is noted, however, that the capacitors C1 and C2 may be eliminated in certain configurations since the bases of the transistors Q1 and Q2 include an associated capacitance. A bias circuit is coupled to the bases of Q1 and Q2. In particular, the base of Q1 is coupled to one end of a pull-up resistor R1 and the base of Q2 is coupled to one end of another pull-up resistor R2. The other ends of the resistors R1 and R2 are coupled together at a bias voltage signal VBIAS1.

The emitter of Q1 is coupled to one end of a capacitive network CN and the emitter of Q2 is coupled to the other end of the capacitive network CN. In the embodiment shown, the capacitive network CN includes a pair of capacitors C3 and C4 coupled in series between the emitters of Q1 and Q2. Alternatively, the capacitive network CN may comprise a single capacitor or any combination of one or more capacitive devices. Due to the asymmetry in the construction of IC capacitances, parasitic capacitance to the top and bottom plates are not necessarily equal. A pair of capacitors is used either series connected as shown or connected anti-parallel to maintain differential symmetry.

The emitter of Q1 is also coupled to a first DC current sink 105 formed by a BJT Q3 and the emitter of Q2 is also coupled to a second DC current sink 107 formed by another BJT Q4. In the embodiment shown, the emitter of Q1 is coupled to the collector of Q3 and the emitter of Q2 is coupled to the collector of Q4. The base of Q3 is coupled to the base of Q4 and to one end of capacitors CCS1 and CCS2, forming a node receiving a bias voltage signal VBIAS2. The other ends of the capacitors CCS1 and CCS2 are coupled to electrical ground (GND). The emitter of Q3 is coupled to one end of current sink resistor RCS1 and the emitter of Q4 is coupled to one end of another current sink resistor RCS2. The other ends of the resistors RCS1 and RCS2 are coupled to GND. GND may be resistively coupled to chassis ground for a discrete embodiment or to the substrate of an IC for an integrated embodiment.

An optional pair of capacitors CBE1 and CBE2 may be coupled between the respective bases and emitters of the transistors Q1 and Q2. Alternatively, or in addition, an optional pair of capacitors CCE1 and CCE2 may be coupled between the respective collectors and emitters of the transistors Q1 and Q2.

In operation, a control voltage VCTL is applied across the polarities VCTL+/− to adjust the frequency of operation of the output oscillation signal OSC. The values of VCC and VBIAS1 sets the DC operating point of the transistors Q1 and Q2. The steady state amplitude of OSC may be adjusted by the collective values of VBIAS2 and the resistors RCS1 and RCS2. For example, an increase of the current through the resistors RCS1 and RCS2 (such as by increasing VBIAS2 and/or decreasing RCS1 and RCS2) increases the amplitude of OSC. The capacitors CS1 and CS2 are used to sample the oscillation signal OSC (OSC+/OSC−) to develop the differential output signal OUT (OUT+/OUT−).

The capacitive network CN loads the emitters of the transistors Q1 and Q2, so that the base and collector currents of the transistors Q1 and Q2 become substantially out of phase with the applied differential voltage. Base impedance is defined as the differential collector voltage divided by the base current at the frequency of oscillation of the transistors Q1 and Q2. Collector impedance is defined as the differential collector voltage divided by the collector current at the frequency of oscillation of the transistors Q1 and Q2. Both the base and collector impedances have substantial negative resistance, while their reactive impedances are nearly 180 degrees out of phase. If the magnitudes of the reactive impedances are substantially equal, then the reactive impedances cancel leaving a pure negative differential resistance. It is possible to adjust the magnitudes so that there is net negative capacitance or net positive capacitance in addition to the negative resistance.

It is possible to adjust the capacitance of the capacitive network CN and/or the capacitance of the cross-coupled capacitors C1, C2 so that the net differential capacitance is zero, so that the differential impedance is that of a pure negative resistor. The capacitive impedance due to the delayed transconductance can be eliminated and the real capacitance at the bases and collectors of the transistors Q1 and Q2 can be neutralized. With the reactive portion of the output impedance of the resistance source 103 at zero, the VCO frequency depends entirely upon the differential resonator 101. Even if the reactive portion of the output impedance of the differential resistance source 103 is not exactly at zero, it may be reduced so that oscillator performance is improved.

The optional capacitor pairs CBE1/CBE2 and/or CCE1/CCE2 may be added to eliminate the reactive portion of the output impedance of the differential resistance source 103 depending upon the relative speed of the transistors Q1 and Q2 compared to the VCO frequency, especially if the transistors are relatively fast as compared to the VCO frequency. Also, the additional capacitor pairs may be added if the values for the capacitive network CN and/or the capacitors C1/C2 are inconvenient value(s) for any reason. The extra capacitors may also be employed depending upon the transistor bias. The negative output conductance of the differential resistance source 103 is smaller as compared to a conventional differential configuration for a given DC bias, and a somewhat greater level of bias current may be used if the Q factor of the differential resonator 101 is relatively low.

The reactive impedance portion of the differential resistance source 103 depends upon the active device bias conditions. Bias modulation may be employed to affect the VCO frequency in a beneficial way, such as, for example, by compensating for any temperature coefficient of the varactor diodes D1 and D2 so that the net temperature coefficient of the differential VCO 100 is very small. Bias modulation may also be used to compensate for supply voltage variations.

The capacitive network CN and the current sinks 105 and 107 form a capacitive degeneration circuit for modifying capacitive output of the differential negative resistance source 103 and optimizing operation of the differential VCO 100. The illustrated embodiment shows capacitive degeneration for BJT configurations. The exemplary embodiments are illustrated using BJT pairs Q1 and Q2 as the active devices, where it is understood that other transistor types may be employed, such as FETs or MOSFETs or the like. Voltage levels and/or component values may be adjusted for alternative transistor types to achieve the desired operating characteristics as described herein, but otherwise operation is substantially similar. For FET configurations (including MOSFETs), capacitive source degeneration (or capacitive drain degeneration) is employed to add negative compensation capacitance. In either case, common current terminals of a differential pair of transistors are disconnected, a capacitive network is coupled between the current terminals, and separate current sinks are provided for each transistor. Capacitive, resistance and/or voltage values are tuned or otherwise adjusted to reduce or otherwise eliminate differential capacitance at the output of the differential negative resistance source.

For BJT embodiments, capacitive emitter degeneration is added to overcome detrimental effects of the base resistances ($r_b$) of a differential pair of BJTs typically used in negative resistor sources. The base resistance $r_b$ causes a phase shift which adds an effective capacitance proportional to the BJT transconductance of the differential pair. The additional capacitance is proportional to the collector current so that changes in bias current changes both the real and imaginary parts of the conductance. When the differential pair is employed as a negative resistance generator in an oscillator, changes in bias current modulate the oscillator frequency. For a given fixed frequency, the additional capacitance from the negative resistance generator means that either the inductor (L1) or the varactor have to be reduced, which results in a lower Q factor, higher phase noise and problems in oscillator tuning.

Capacitive emitter degeneration is added by splitting the common-emitter configuration of the conventional differential pair of BJTs and adding a second current sink is so that the emitters are no longer common, and adding a capacitive network to provide an AC path between the emitters. The capacitance of the capacitive network is "tuned" or otherwise selected to reduce or otherwise eliminate net differential capacitance applied to the differential resonator 101. The values of the cross-coupled capacitors (C1, C2) may also be tuned or adjusted for optimized operation if included as separate capacitors. The values of the optional pairs of capacitors (CBE1/CBE2 and/or CCE1/CCE2), if provide, may also be tuned or adjusted for optimized operation. The DC bias operating points may also be tuned or adjusted for optimized operation. The phase of both the base and collector currents are shifted by the addition of capacitive emitter degeneration for BJT embodiments. The negative capacitance from the output of phase collector current cancels the positive capacitance from the base current, resulting in a pure negative conductance/resistance. Additional negative capacitance cancels any additional parasitic capacitances, such as collector-base capacitors. A negative capacitance cancels a positive capacitance over a broad frequency range. Capacitive emitter degeneration can also help compensate for any phase shift in transconductance due to the time constant of BJTs based on parasitic capacitance and base resistance.

A differential resistance source according to an embodiment of the present invention improves oscillator noise performance as compared to conventional designs, and is particularly useful if the noise is otherwise substantially degraded by using slow transistors. In an actual 10 gigahertz (GHz) VCO design using a conventional negative resistor source with worst-case process for the transistors, the oscillator was inoperable and would not even oscillate. A 10 GHz oscillator has a quarter period of 25 picoseconds (ps), and the transistor delay assuming worst-case process became significant to degrade VCO performance. The present invention enables an increase of the maximum operating frequency for a given process and can be used to guarantee oscillation for a given frequency and worst-case process. The present invention permits the resonator and the negative resistance generator to be designed and optimized independently, which saves development time. The present invention enables a differential VCO to be less sensitive to operating conditions.

Although the present invention has been described in considerable detail with reference to certain exemplary versions thereof, it is not intended to be limited to the specific form set forth herein, but on the contrary, it is intended to cover such alternatives, modifications, and equivalents, as can be reasonably included within the spirit and scope of the invention. For example, the BJT pairs Q1 and Q2 and/or Q3 and Q4 may be replaced with MOSFETs or the like. The analysis and benefits are substantially even though component values and voltage levels may need to be adjusted for MOSFET operation. Those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. A differential negative resistance generator for providing negative resistance to a differential resonator of a differential voltage controlled oscillator (VCO), comprising:
   first and second active devices, each having first and second current terminals and a control terminal;
   first and second current sinks, each coupled to a corresponding one of said second current terminals of said first and second active devices; and
   a capacitive degeneration circuit coupled to said first and second active devices and operative to cancel at least a portion of extra capacitance of the differential negative resistance generator applied to the differential resonator, the capacitive degeneration circuit including at least one capacitive device coupled between said second current terminals of said first and second active devices that has a capacitance value selected so that the negative resistance generator has only negative resistance and the reactive component of impedance is eliminated, and further comprising first and second current sinks, each coupled to an emitter of a respective one of said first and second active devices, wherein said firs and second current sinks each comprises:
   a current sink transistor having an emitter, a collector coupled to an emitter of a respective one of said first and second active devices, and a base coupled to a bias voltage.

2. The differential negative resistance generator of claim 1, further comprising:
   a first capacitor coupled between said control terminal of said first active device and said first current terminal of said second active device; and
   a second capacitor coupled between said control terminal of said second active device and said first current terminal of said first active device.

3. The differential negative resistance generator of claim 1, further comprising a bias circuit coupled to said control terminals of said first and second active devices.

4. The differential negative resistance generator of claim 3, wherein said bias circuit comprises:
   a first resistor coupled between said control terminal of said first active device and a bias voltage; and
   a second resistor coupled between said control terminal of said second active device and said bias voltage.

5. The differential negative resistance generator of claim 1, wherein said at least one capacitive device comprises at least one capacitor.

6. The differential negative resistance generator of claim 1, wherein said at least one capacitive device comprises first and second capacitors coupled in series between said second current terminals of said first and second active devices.

7. The differential negative resistance generator of claim 1, wherein said first and second active devices comprise bipolar junction transistors in which said first current terminals are collector terminals, and the second current terminals are emitter terminals, and said control terminals are base terminals.

8. The differential negative resistance generator of claim 1, wherein said first and second active devices comprise MOSFETs in which said control terminals are gate terminals.

9. The differential negative resistance generator of claim 1, further comprising first and second capacitors, each coupled between said first and second current terminals of a respective one of said first and second active devices.

10. The differential negative resistance generator of claim 1, further comprising first and second capacitors, each coupled between said control terminal and second current terminal of a respective one of said first and second active devices.

11. A differential negative resistance voltage controlled oscillator (VCO), comprising:
   a resonator having first and second terminals that generate a differential oscillation signal with first and second polarity signals;
   first and second capacitors for sampling an oscillation signal to develop a differential Output signal; and
   a differential negative resistance source coupled to said resonator, comprising:
   first and second transistors, each having a controlled first and a second current path and a control terminal, wherein said control current path of each of said first and second transistors is coupled to a respective one of said first and second polarity signals of said differential oscillation signal; and
   a capacitive degeneration circuit including at least one capacitive device coupled to said controlled current paths of first and second transistors that has a capacitance value selected so that the negative resistance source has only negative resistance and the reactive component of impedance is eliminated; and
   first and second current sinks, each coupled to a corresponding one of said controlled current paths of said first and second transistors, wherein said first and second current sinks each comprise:
   a current sink transistor having an emitter, a collector coupled to an emitter of a respective one of said first and second transistors, and a base coupled to a bias voltage.

12. The differential negative resistance VCO of claim 11, wherein;
   said first transistor comprises a first BJT having a collector coupled to said first polarity of said differential oscillation signal and an emitter coupled to said capacitive degeneration circuit;
   said second transistor comprises a second BJT having a collector coupled to said second polarity of said differential oscillation signal and an emitter coupled to said capacitive degeneration circuit;
   wherein said capacitive degeneration circuit comprises:
   a capacitive network coupled between emitters of said first and second BJTs; and
   first and second current sinks, each coupled to an emitter of a respective one of said first and second BJTs.

13. A differential negative resistance voltage controlled oscillator (VCO), comprising:
   a resonator having first and second terminals that generate a differential oscillation signal with first and second polarity signals;
   a differential negative resistance source coupled to said resonator, comprising:

first and second transistors, each having a controlled current path and a control terminal, wherein said control current path of each of said first and second transistors is coupled to a respective one of said first and second polarity signals of said differential oscillation signal; and a capacitive degeneration circuit coupled to said controlled current paths of first and second transistors, said capacitive degeneration circuit operative to cancel at least a portion of extra capacitance of said differential negative resistance source applied to said resonator;

wherein said first transistor comprises a first BJT having a collector coupled to said first polarity of said differential oscillation signal and an emitter coupled to said capacitive degeneration circuit;

said second transistor comprises a second BJT having a collector coupled to said second polarity of said differential oscillation signal and an emitter coupled to said capacitive degeneration circuit;

said capacitive degeneration circuit further comprising:

a capacitive network coupled between emitters of said first and second BJTs; and first and second current sinks, each coupled to an emitter of a respective one of said first and second BJTs;

wherein said first and second current sinks each comprises:

a current sink transistor having an emitter, a collector coupled to an emitter of a respective one of said first and second BJTs and a base coupled to a bias voltage;

a resistor coupled between said emitter of said current sink transistor and ground; and a capacitor coupled between said base current sink transistor and ground.

14. The differential negative resistance VCO of claim 13, further comprising:

a first capacitor coupled between a base of said first BJT and a collector of said second BJT; and a second capacitor coupled between a base of said second BJT and a collector of said first BJT.

15. The differential negative resistance VCO of claim 14, further comprising a bias circuit that resistively couples said bases of said first and second BJTs to a bias voltage.

16. The differential negative resistance VCO of claim 15, wherein said resonator comprises an inductor coupled between said first and second polarity signals of said oscillation signal, said inductor having a center tap coupled to a DC supply voltage.

17. The differential negative resistance VCO of claim 13, further comprising first and second capacitors, each coupled between said collector and said emitter of a respective one of said first and second BJTs.

18. The differential negative resistance VCO of claim 13, further comprising first and second capacitors, each coupled between said base and said emitter of a respective one of said first and second BJTs.

19. A method of optimizing operation of a differential VCO having a differential resonator with a differential oscillation output, comprising:

coupling a differential output of a differential pair of transistors to the differential oscillation output;

splitting the differential pair of transistors into first and second transistors by disconnecting common current terminals;

coupling a first DC bias current sink to a current terminal of the first transistor and coupling a second DC bias current sink to a current terminal of the second transistor, wherein coupling each of said first and second DC bias current sinks to said first and second transistors respectively comprises coupling an emitter of each of the first and second transistors to a collector of respective current sink transistor and a base of each of the respective current sink transistors to a bias voltage; and adding at least one capacitor between the current terminals of the first and second transistors to thereby cancel at least a portion of extra capacitance of the differential output applied to the differential resonator, wherein the capacitor has a capacitance value selected so that the differential output has only negative resistance and the reactive component of impedance is eliminated.

20. The method or claim 19, further comprising:

tuning the at least one capacitor to reduce net differential capacitance applied to the differential resonator.

21. The method of claim 19, further comprising:

cross-coupling feedback capacitors between said first and second transistors; and tuning the cross-coupled capacitors and the at least one capacitor to reduce net differential capacitance applied to the differential resonator.

* * * * *